(12) United States Patent
Totani et al.

(10) Patent No.: US 9,668,375 B2
(45) Date of Patent: May 30, 2017

(54) ATMOSPHERIC COOLING OF SERVERS IN A DATA CENTER

(71) Applicant: Yahoo! Inc., Sunnyvale, CA (US)

(72) Inventors: Mozan Totani, San Jose, CA (US); Barry Bianculli, Los Banos, CA (US)

(73) Assignee: Yahoo! Inc., Sunnyvale, CA (US)

( * ) Notice: Subject to any disclaimer, the term of this patent is extended or adjusted under 35 U.S.C. 154(b) by 403 days.

(21) Appl. No.: 14/210,171

(22) Filed: Mar. 13, 2014

(65) Prior Publication Data

US 2014/0259966 A1    Sep. 18, 2014

Related U.S. Application Data

(60) Provisional application No. 61/800,707, filed on Mar. 15, 2013.

(51) Int. Cl.
*H05K 7/20* (2006.01)
*E04H 5/00* (2006.01)

(52) U.S. Cl.
CPC ..... *H05K 7/20136* (2013.01); *H05K 7/20709* (2013.01); *H05K 7/20736* (2013.01); *H05K 7/20836* (2013.01); *E04H 2005/005* (2013.01)

(58) Field of Classification Search
CPC .. H05K 7/20; H05K 7/20009; H05K 7/20127; H05K 7/20136; H05K 7/20145; H05K 7/20154; H05K 7/20163; H05K 7/20172; H05K 7/20181; H05K 7/2019; H05K 7/202; H05K 7/20209; H05K 7/20536; H05K 7/206; H05K 7/20609; H05K 7/20618; H05K 7/20636; H05K 7/20645; H05K 7/20654; H05K 7/207; H05K 7/20709; H05K 7/20836;

(Continued)

(56) References Cited

U.S. PATENT DOCUMENTS 5,639,188 A  *  6/1997  Howanski ............ B65G 69/181
                                                        406/151
8,659,895 B1 *  2/2014  Carlson ............. H05K 7/20745
                                                        361/694

(Continued)

FOREIGN PATENT DOCUMENTS

JP     U 57-198293 A    12/1982
JP       08210685 A     8/1996

(Continued)

OTHER PUBLICATIONS

ESR 14764272.2, dated Oct. 4, 2016, 8 pages.
ISR PCTUS2014029684, Aug. 8, 2014, 13 pages.

*Primary Examiner* — Steven B McAllister
*Assistant Examiner* — Ko-Wei Lin
(74) *Attorney, Agent, or Firm* — Martine Penilla Group, LLP

(57) ABSTRACT

A building for a data center (or server farm) includes a stack structure that interfaces with an environment and one or more housings coupled to a floor and the stack structure. Each of the housings includes one or more racks with a plurality of servers and each of the servers includes a computer fan capable of varying speed or reversing direction. The building also includes one or more filters between the one or more housings and the environment and one or more walls operable to be between the one or more filters and the environment.

20 Claims, 12 Drawing Sheets

(58) Field of Classification Search
CPC ........... H05K 7/20845; H05K 7/20854; H05K 7/2089; H05K 7/209; H05K 7/20909
USPC ........................................................ 454/184
See application file for complete search history.

(56) References Cited

U.S. PATENT DOCUMENTS

| | | |
|---|---|---|
| 2007/0178823 A1* | 8/2007 | Aronstam ................. F24F 3/00 454/256 |
| 2009/0151910 A1 | 6/2009 | Kwon et al. |
| 2010/0130117 A1 | 5/2010 | Larsen |
| 2010/0170277 A1* | 7/2010 | Schmitt .............. H05K 7/20745 62/259.2 |
| 2010/0263830 A1 | 10/2010 | Noteboom et al. |
| 2011/0009047 A1 | 1/2011 | Noteboom et al. |
| 2011/0057803 A1 | 3/2011 | Yamaoka et al. |
| 2011/0094714 A1 | 4/2011 | Day |
| 2011/0153524 A1 | 6/2011 | Schnackel |
| 2013/0040547 A1 | 2/2013 | Moore |

FOREIGN PATENT DOCUMENTS

| | | |
|---|---|---|
| JP | 2008214933 A | 9/2008 |
| JP | 2010050220 A | 3/2010 |
| JP | 2011215668 A | 10/2011 |
| KR | 10-1134468 B1 | 4/2012 |

* cited by examiner

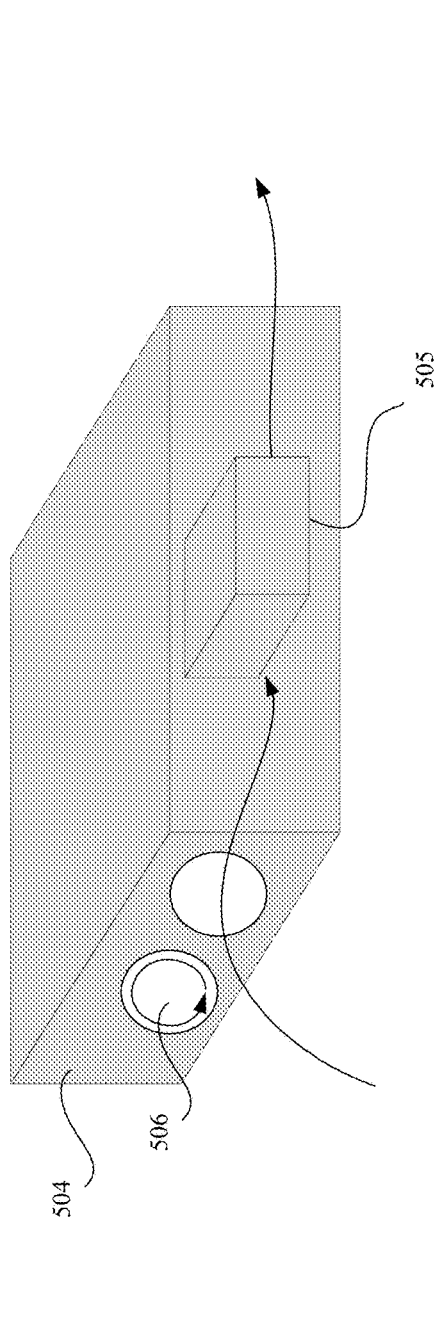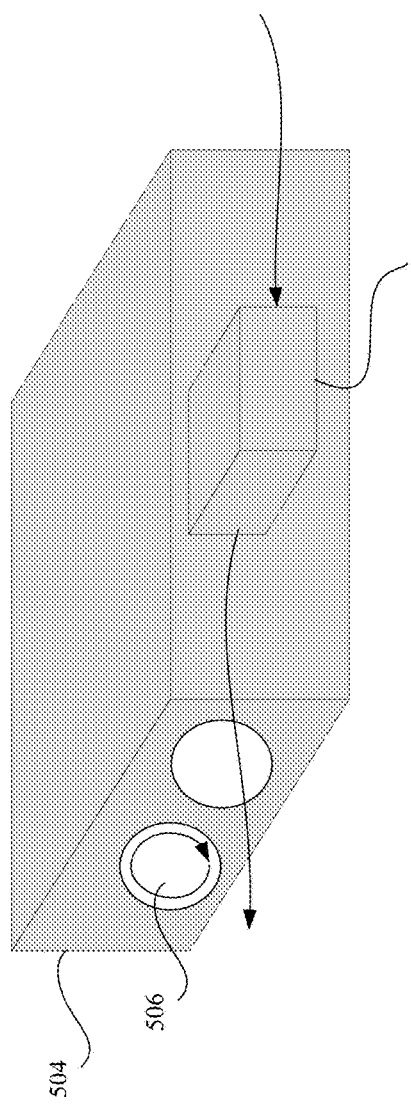

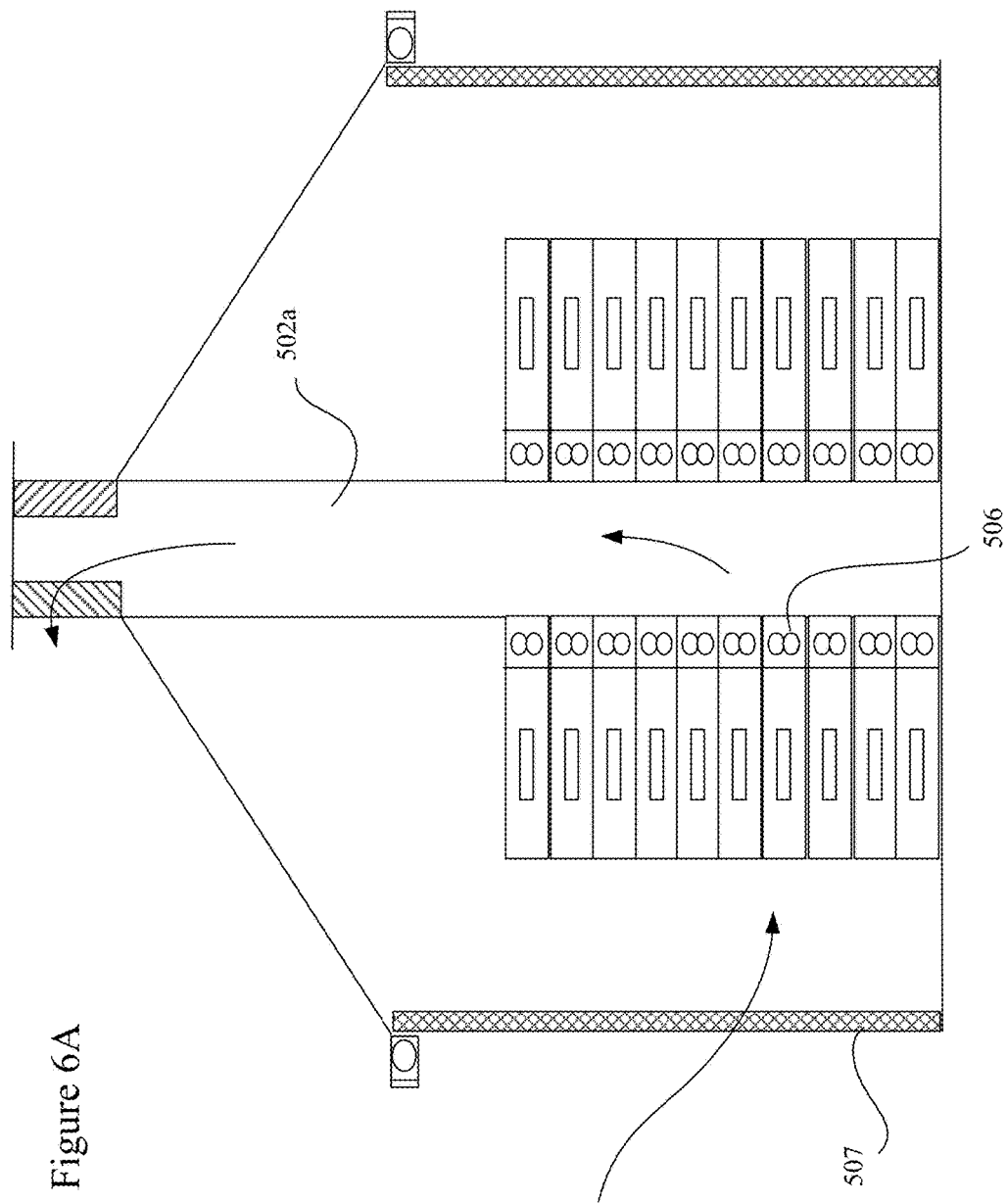

US 9,668,375 B2

ATMOSPHERIC COOLING OF SERVERS IN A DATA CENTER

RELATED APPLICATIONS

This application claims priority to U.S. Provisional Application No. 61/800,707, also entitled "Atmospheric Cooling of Servers in a Data Center", filed on Mar. 15, 2013, and hereby incorporates by reference the disclosure of that application.

BACKGROUND

The microprocessor and other integrated circuits in a server generate a significant amount of heat which is exhausted from the computer using a computer fan.

A data center or "server farm" might contain hundreds of servers in racks, resulting in large amounts of heat that could interfere with operation of the servers (e.g., the circuitry on motherboards), if not dissipated.

For this reason, some organizations that maintain data centers locate them in geographic locations in cooler climes. However, those cooler climes can present problems of their own when environmental temperatures fall to levels that retard the operation of moving parts, such as hard disk drives, in servers.

SUMMARY

In an example embodiment, an apparatus is described. The apparatus is a building for a data center (or server farm). The building includes a stack structure that interfaces with an environment and one or more housings coupled to a floor and the stack structure. Each of the housings includes one or more racks with a plurality of servers and each of the servers includes a computer fan capable of varying speed or reversing direction. The building also includes one or more filters between the one or more housings and the environment and one or more walls operable to be between the one or more filters and the environment.

In another example embodiment, an apparatus is described. The apparatus is a building for a data center (or server farm). The building includes an attic coupled to a floor. The attic includes a stack structure that interfaces with an environment. The building also includes one or more housings coupled to the floor. The attic includes a bottom surface that is coupled to the one or more housings. Each of the housings includes one or more racks with a plurality of servers and each of the servers includes a computer fan capable of varying speed or reversing direction. The building also includes one or more filters between the one or more housings and the environment and one or more walls operable to be between the one or more filters and the environment.

Another example embodiment also involves a method. According to the method, a geographic location is ascertained where the rate of environmental temperature change per time interval is relatively small. Then a building is erected at the ascertained geographic location. The building includes a stack structure that interfaces with an environment and one or more housings coupled to a floor and the stack structure. Each of the housings includes one or more racks with a plurality of servers and each of the servers includes a computer fan capable of varying speed or reversing direction. The building also includes one or more filters between the one or more housings and the environment and one or more walls operable to be between the one or more filters and the environment.

BRIEF DESCRIPTION OF THE DRAWINGS

FIGS. 5B and 5C are diagrams showing controllable computer fans, in accordance with an example embodiment.

FIG. 6A is a diagram showing air flows in a building that houses servers for a data center, in accordance with an example embodiment.

DETAILED DESCRIPTION

In the following description, numerous specific details are set forth in order to provide a thorough understanding of the exemplary embodiments. However, it will be apparent to one skilled in the art that the example embodiments may be practiced without some of these specific details. In other instances, process operations and implementation details have not been described in detail, if already well known.

Figure 1:
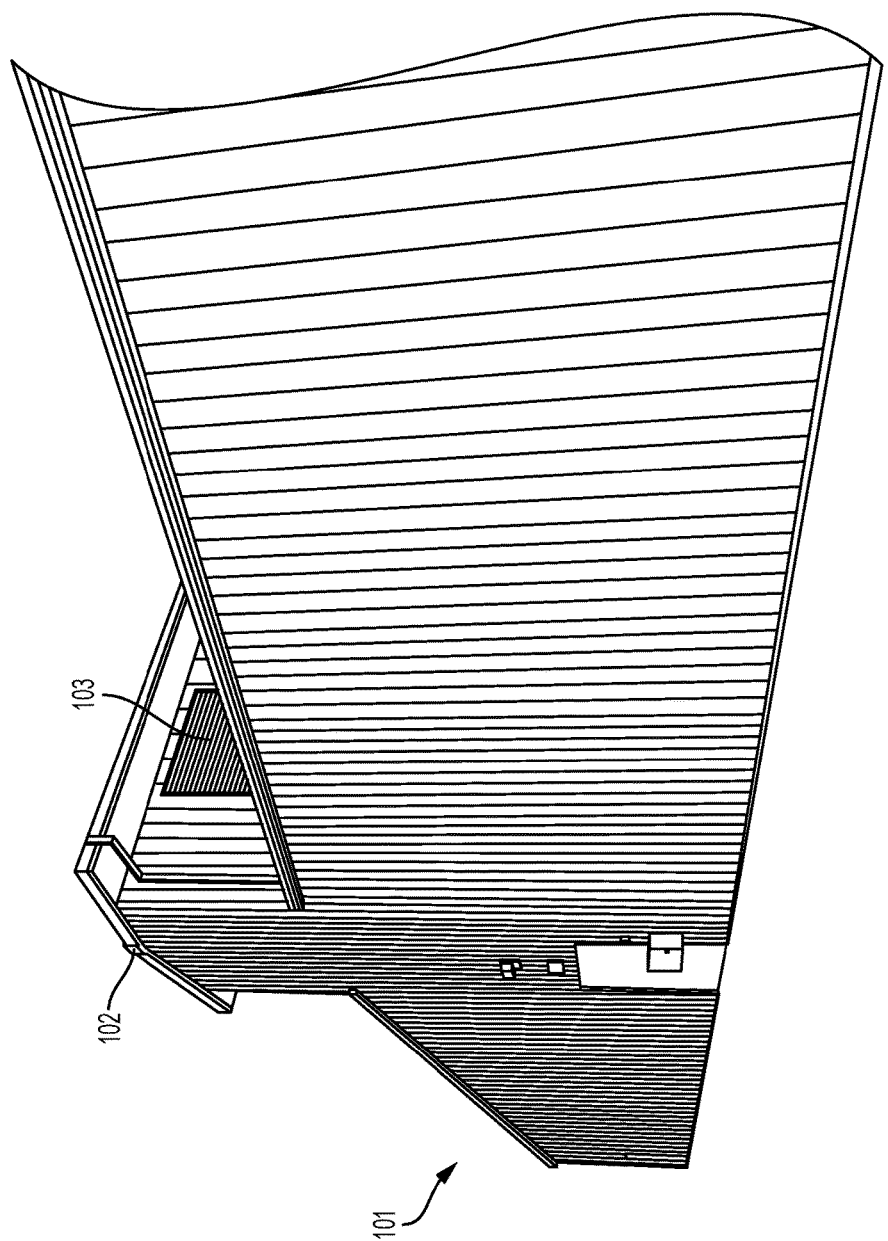
FIG. 1 is an external view of a building that houses servers for a data center (or server farm).

FIG. 1 is an external view of a building that houses servers (e.g., servers) for a data center (or server farm). As shown in this figure, building 101 might include a stack (or chimney) structure 102 with windows 103. In an example embodiment, windows 103 might have screens or louvers that protect the interior of building 101 from such things as environmental particulates (including moisture) and/or debris (e.g., leaves, grass, dirt, sand, etc.). It will be appreciated that the stack structure 102 facilitates the movement of relatively warm (e.g., air that has been warmed by the servers in the data center) air out of building 101 into the environment, through the use of the stack effect or buoyancy. In an example embodiment, the floor for building 101 might be approximately 80 feet by approximately 150 feet and the height of the building from the floor to the top of stack structure 102 might be approximately 33 feet. Also as shown in FIG. 1, administrative personnel might access the servers inside the data center through a door in building 101.

Figure 2:
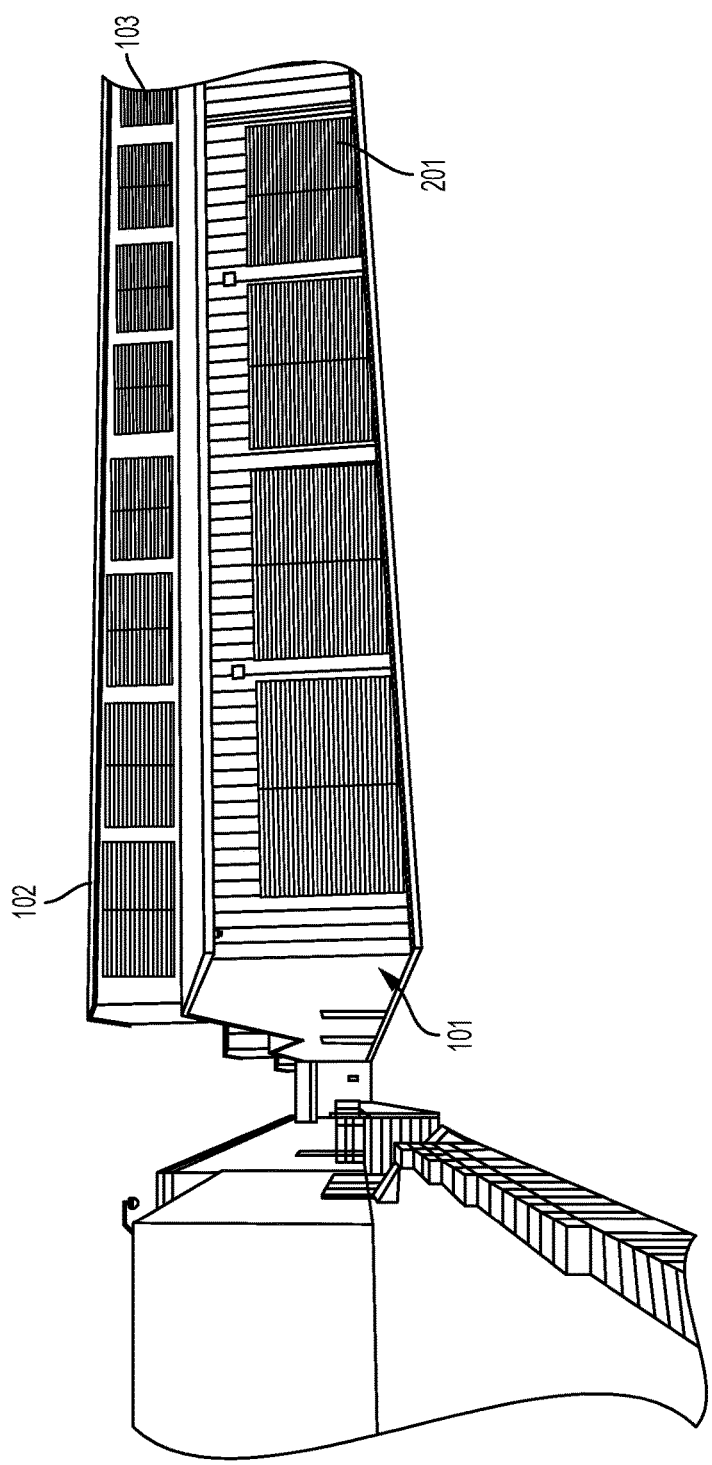
FIG. 2 is another external view of a building that houses servers for a data center.

FIG. 2 is another external view of a building that houses servers for a data center. As shown in this figure, building

101 might include a number of mixing chambers, such as mixing chamber 201, which facilitate the movement of relatively cool air (e.g., air that has not been warmed by the servers in the data center) from the environment into the building 101. In an example embodiment, mixing chamber 201 might have screens or louvers that protect the interior of building 101 from such things as environmental particulates (including moisture) and/or debris (e.g., leaves, grass, dirt, sand, etc.). It will be appreciated as shown in FIG. 2, relatively cool air (a) might enter building 101 through mixing chamber 201, (b) be warmed by servers inside building 101, and (c) exit building 101 through window 103 in stack 102.

Figure 3:
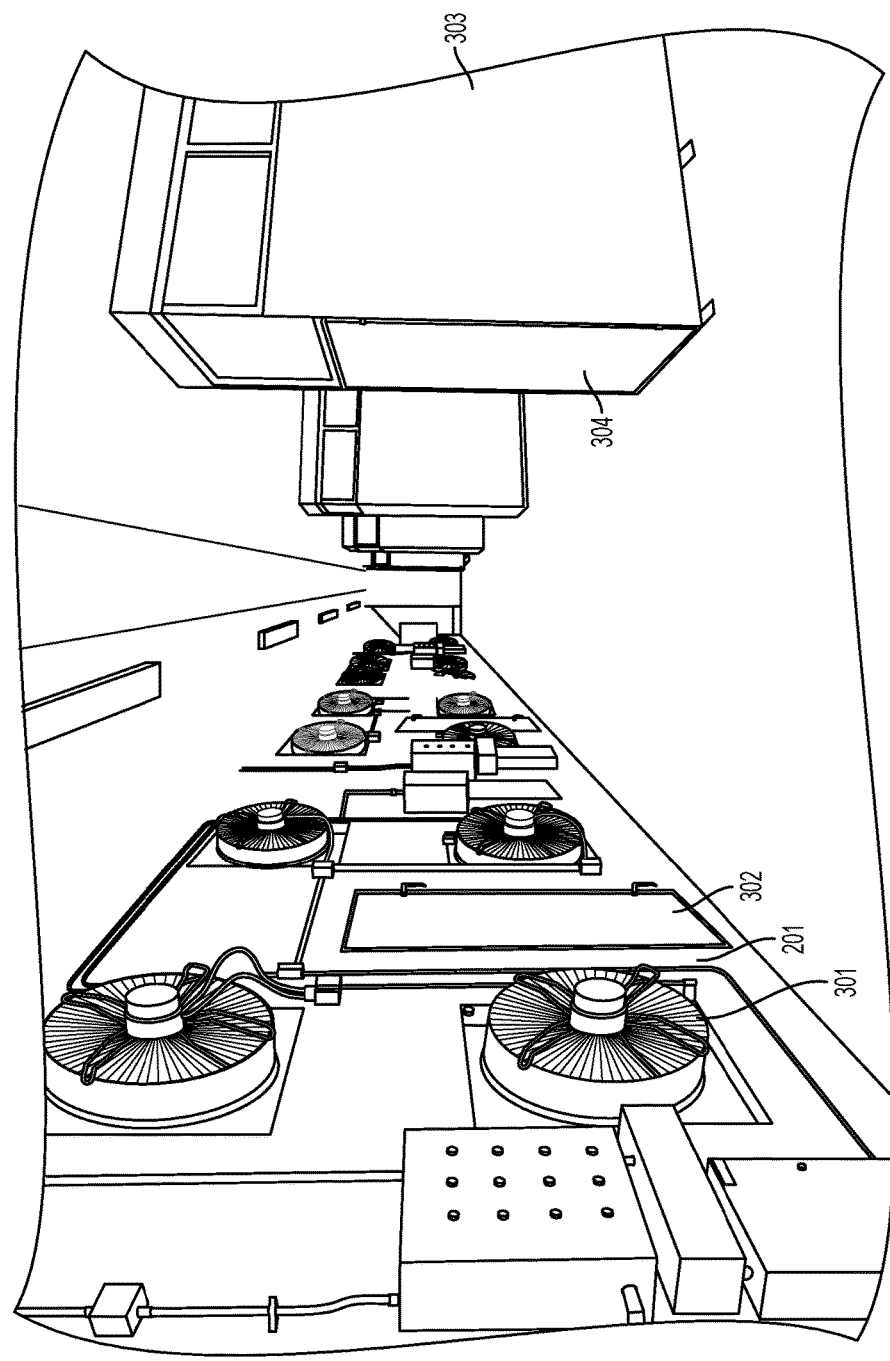
FIG. 3 is an internal view of a building that houses servers for a data center.

FIG. 3 is an internal view of a building that houses servers for a data center. As shown in this figure, mixing chamber 201 is a mixing chamber viewed from the interior of the building, rather than the exterior of the building, as in the prior figure. Mixing chamber 201 might include a fan 301 and a door 302 and be approximately 5 feet long by approximately 15 feet wide and approximately 12 feet high. The door 302 allows administrative personnel to enter mixing chamber 201, e.g., to replace or adjust screens or louvers. Fan 301 might be used to wholly or partially counteract the air pressure drop that results from mixing chamber 201. It will be appreciated that an air pressure drop might result from the frictional obstruction of air flowing into a constrained space such as mixing chamber 201.

As explained in co-owned U.S. Patent Application No. 2011/0009047, entitled Integrated Building Based Air Handler for Server Farm Cooling System", filed on Jul. 9, 2009, by Noteboom and Robinson (which is incorporated herein by reference and hereafter referred to as "Noteboom"), mixing chamber 201 might be used to warm relatively cold air from the environment (e.g., 35 degrees Fahrenheit) by mixing it with air warmed by the servers in the building and re-circulated into the mixing chamber through, e.g., the use of dampers. Such warming might be used to achieve a desired consistent temperature for air proximate to the servers, e.g., in the range of approximately 65-95 degrees Fahrenheit, with 85 degrees Fahrenheit being nominal. It will be appreciated that such a desired consistent temperature might promote server operability (e.g., reading and writing by a hard disk drive) and/or prolong server life (e.g., reduce damage to connections on a motherboard). In an alternative scenario, mixing chamber 201 might include an evaporative or "swamp" cooler (e.g., with an evaporative media such as a fiberglass pad in water) that is used to cool (e.g., using adiabatic cooling) relatively warm air from the environment (e.g., above 85 degrees Fahrenheit) to a desired consistent temperature, e.g. in the range of approximately 65-95 degrees Fahrenheit, with 85 degrees Fahrenheit being nominal.

Figure 4:
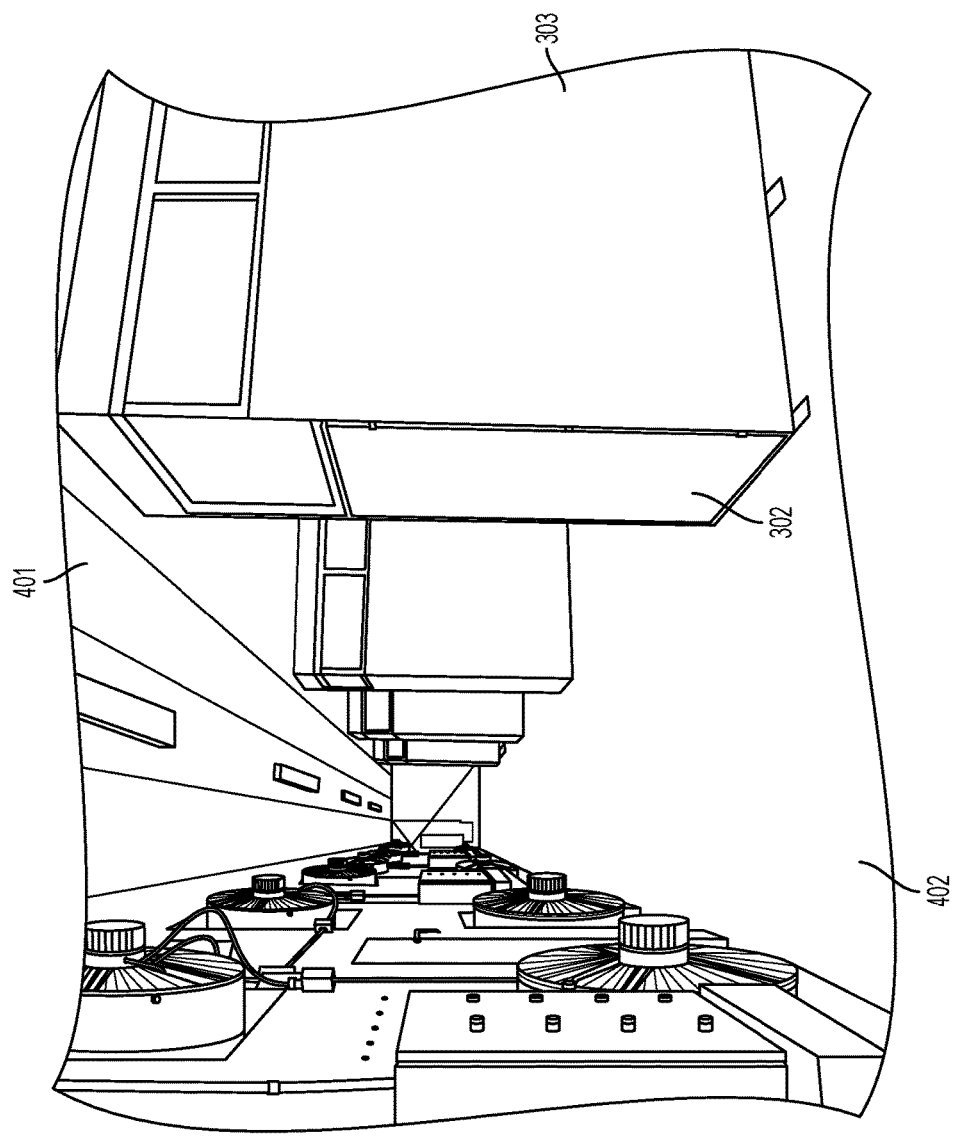
FIG. 4 is an external view of a housing for servers in a building for a data center.

Also shown in FIG. 3 is a housing 303 for servers with a door 304 that allows administrators to enter the housing and maintain or replace servers, e.g., in racks inside the housing. FIG. 4 also shows housing 303 and door 304. It will be appreciated that housing 303 is supported by the building's floor 402, but is elevated above floor 402 (e.g., a cement floor) to allow air (e.g., air blown by the fan out of the mixing chamber) to reach the servers in the racks in housing 303. FIG. 4 also shows a ceiling 401 which is tightly connected to housing 303, e.g., to prevent the escape of air that has been warmed by the servers and which is being routed to the building's stack, e.g., by computer fans in the servers. It will be appreciated that ceiling 401 creates an enclosed attic space in the building above the housings such as housing 303.

Figure 5A:
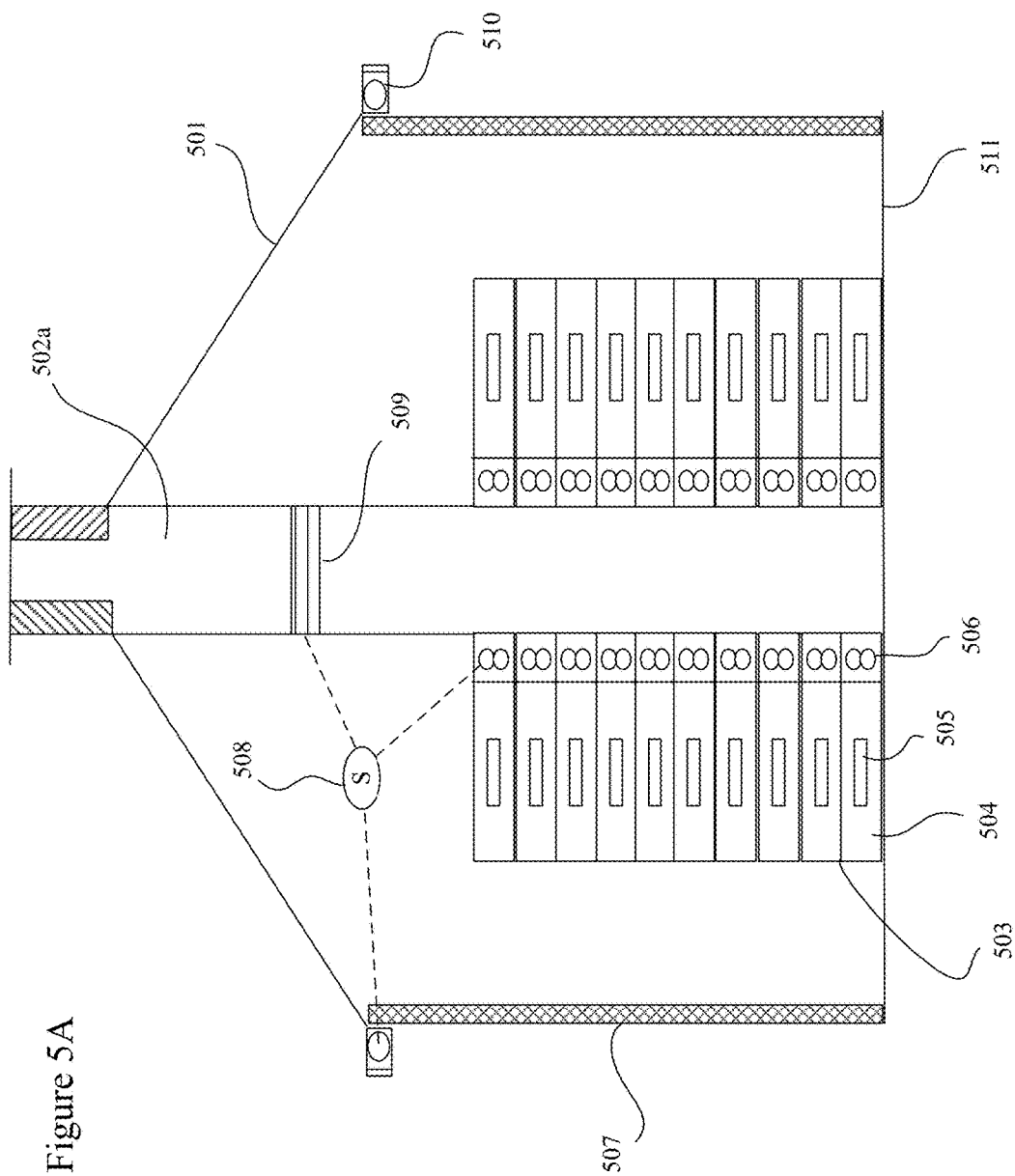
FIG. 5A is a diagram showing an internal view of a building that houses servers for a data center, in accordance with an example embodiment.

FIG. 5A is a diagram showing an internal view of a building that houses servers for a data center, in accordance with an example embodiment. As shown in this figure, the building includes a roof 501 and a stack (or chimney) structure 502a through which air from the building can flow into the environment. The building also includes housings for servers, such as housing 503, which includes a rack of servers (e.g., blade servers). Each server, such as server 504, includes (a) one or more processors (e.g., a microprocessor) such as processor 505 and (b) one or more (e.g., 1, 2, or 3) computer fans such as computer fan 506, which might be variable as to activation, speed, direction, etc. Housing 503 is supported by the building floor 511 and connects to stack structure 502a. Stack structure 502a includes damper 509, which can be used to trap relatively warm air flowing out of the servers in housing 503 into the stack structure 502a.

As also depicted in FIG. 5A, a filter 507 (e.g., an air filter and/or a mesh filter) protects the interior of the building from such things as environmental particulates (including moisture) and/or debris (e.g., leaves, grass, dirt, sand, etc.). Roll-up wall 510 can be used to keep out air from the environment, e.g., air which is relatively cold in comparison to air in the building. Roll-up wall 510 can also be used for protection against wind, moisture, debris, and or other environmental hazards that are not fully protected against by filter 507. In an example embodiment, roll-up wall 510 might be manually operated or automated.

Also shown in FIG. 5A is controller 508 which might control computer fan 506, damper 509, and/or roll-up wall 510, in an example embodiment. Controller 508 might include a computer device with software, firmware, and/or hardware (e.g., a microprocessor and volatile and/or persistent storage) connected to one or more sensors (e.g., a sensor that measures temperature, humidity, air pressure, particulate matter, etc.). In an example scenario, controller 508 might determine that the temperature of the air proximate to the servers has risen at a rate above the server manufacturer's maximum allowable rate of change upwards, e.g., nine degrees Fahrenheit within one hour. And therefore, controller 508 might cause (e.g., through a command transmitted over a wire or wirelessly) the computer fans in the servers (such as computer fan 506) to operate at a higher speed. In another example embodiment, controller 508 might be a component of server 504 and/or its computer fan 506, rather than external to server 504 a shown in FIG. 5A. Alternatively, controller 508 might remedy the rising temperature by opening the damper 509 or raising one or more of the roll-up walls (e.g., roll-up wall 510), e.g., through a command transmitted over a wire or wirelessly.

Or in another example scenario, controller 508 might determine that the temperature of the air proximate to the servers has dropped at a rate that exceeds the server manufacturer's maximum allowable rate of change downward, e.g., nine degrees Fahrenheit within one hour. And therefore, controller 508 might cause (e.g., through a command transmitted over a wire or wirelessly) the computer fans in the servers (such as computer fan 506) to turn in a direction that reduces the flow of warm air from the servers (such as server 504) into the stack structure 502a. Here again, in another example embodiment, controller 508 might be a component of a server 504 and/or its computer fan 506, rather than external to server 504 a shown in FIG. 5A. Alternatively, controller 508 might remedy the falling temperature by closing the damper 509 or lowering the roll-up walls (e.g., roll-up wall 510), (e.g., through a command transmitted over a wire or wirelessly).

It will be appreciated that the building shown in FIG. 5A does not include a mixing chamber as described above. This provides economic benefits both at the time of construction of the building (e.g., the construction cost of the mixing chamber is avoided) and throughout the building's lifetime (e.g., no ongoing operational/maintenance costs related to the mixing chamber's fan, the building can accommodate more servers, etc.).

It will be further appreciated that the building in FIG. 5A does not maintain a consistent temperature with respect to air proximate to the servers in the data center. Rather, the controller 508 monitors whether the temperature proximate to the servers has dropped (or risen) at a rate that exceeds the server manufacturer's maximum allowable rate of change downward (or upward), e.g., nine degrees Fahrenheit within one hour. As discussed in further detail elsewhere, the probability of such a temperature change can be reduced through appropriate selection of a geographic location for the building. In many instances, geographic locations in relatively colder climes might not be appropriate selections.

FIGS. 5B and 5C are diagrams showing controllable computer fans, in accordance with an example embodiment. As shown in FIGS. 5B and 5C, a server 504 (e.g., a blade server) includes two computer fans (e.g., computer fan 506) and a processor 504 (e.g., a microprocessor) which generates heat during operation. The direction (e.g., blade spinning counterclockwise) of the computer fan 506 in FIG. 5B causes the relatively warmer air resulting from exposure to processor 505 to be expelled from the server 504, e.g., into the stack structure described above with respect to FIG. 5A. It will be appreciated that the cooling effect depicted in FIG. 5B might also be achieved by increasing the speed of the computer fans or by opening a damper between the server and the stack structure.

In FIG. 5C, the direction (e.g., blade spinning clockwise) of the computer fan 506 causes the relatively warmer air resulting from exposure to processor 505 to be pulled (or pushed) toward the computer fan 504, e.g., away from the stack structure described above with respect to FIG. 5A. It will be appreciated that the warming effect depicted in FIG. 5C might also be achieved by shutting off the computer fans or by lowering a damper between the server and the stack structure.

Figure 5D:
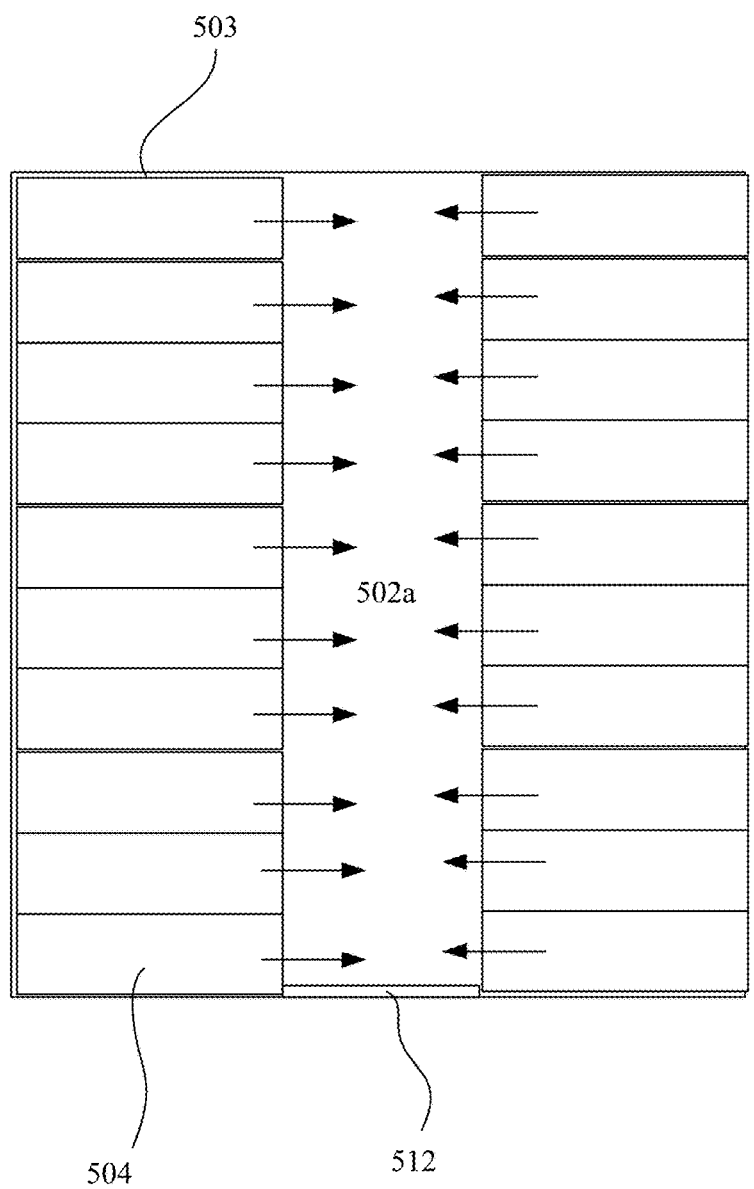
FIG. 5D is a diagram showing an internal view of a housing for servers in a building for a data center, in accordance with an example embodiment.

FIG. 5D is a diagram showing an internal view of two housings for servers in a building for a data center, in accordance with an example embodiment. The viewpoint of this figure is from the top of the housings (e.g., housing 503). Each server (such as server 504) that is shown is the top server on a rack of servers. That is to say, beneath each server that is shown are number of other servers (e.g., a dozen blade servers) in a rack. It will be appreciated that all of the servers are blowing relatively warm air (e.g., air warmed by a processor) into the stack structure 502a. A door 511 allows administrative personnel to enter the space between to the two housings (e.g., the bottom of the stack structure 502a).

Figure 5E:
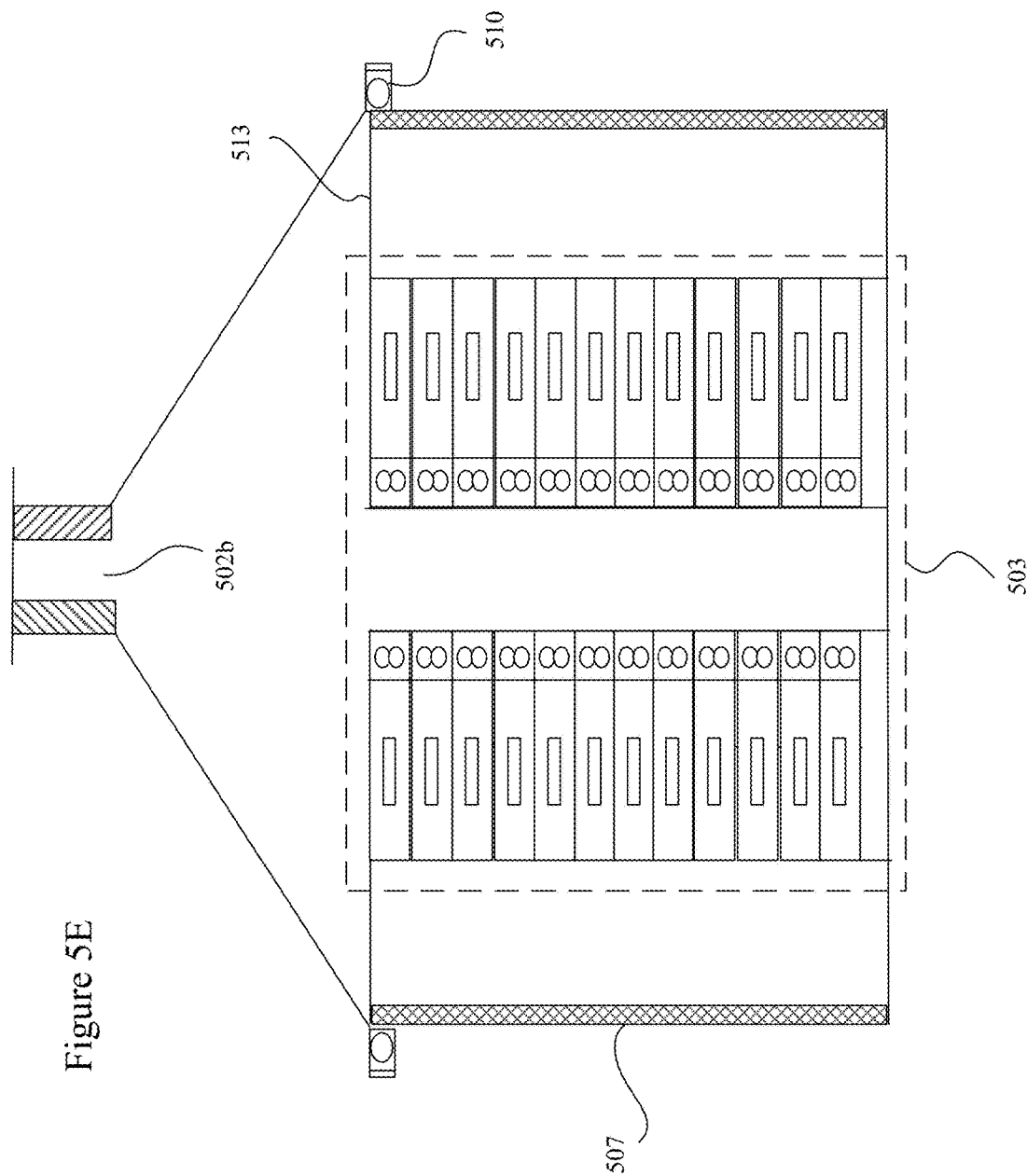
FIG. 5E is a diagram showing an internal view of a building that houses servers for a data center, in accordance with another example embodiment.

FIG. 5E is a diagram showing an internal view of a building that houses servers for a data center, in accordance with another example embodiment. As shown in this figure, the building includes a roof and a stack (or chimney) structure 502b through which air from the building can flow into the environment. The building also includes housings for servers, such as housing 503 (shown within the broken line), which includes two racks of servers (e.g., blade servers) spaced so as to allow access to the servers by administrative personnel. Housing 503 is supported by the building floor and connects to stack structure 502b through an opening in ceiling 513. It will be appreciated that ceiling 513 creates an attic space with the stack structure 502b, e.g., similar to the attic space described in Noteboom. In an example embodiment, housing 503 might provide structural support for other components of the building, including the ceiling 513, the attic space, the stack structure 502b, the roof, etc. It will also be appreciated that air warmed by the servers might rise into the attic space before exiting into the environment through the stack structure 502b.

As also depicted in FIG. 5E, a filter 507 (e.g., an air filter and/or a mesh filter) protects the interior of the building from such things as environmental particulates (including moisture) and/or debris (e.g., leaves, grass, dirt, sand, etc.). Roll-up wall 510 can be used to keep out air from the environment, e.g., air which is relatively warm or relatively cold in comparison to air in the building. Roll-up wall 510 can also be used for protection against wind, moisture, debris, and or other environmental hazards that are not fully protected against by filter 507. In an example embodiment, roll-up wall 510 might be manually operated or automated. A controller such as the controller described above might be used to control computer fans and roll-up wall 510, in an example embodiment.

Figure 5F:
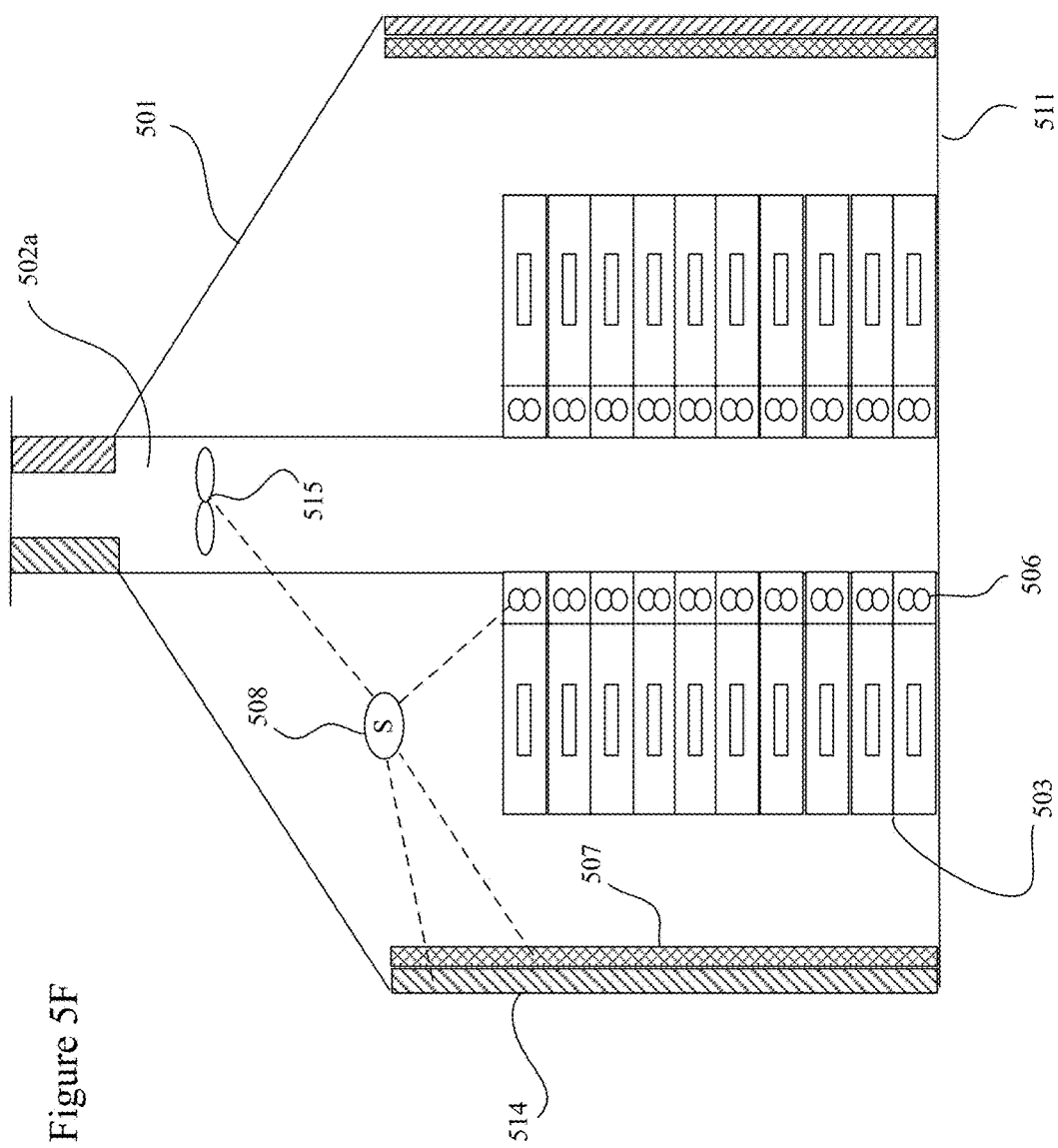
FIG. 5F is a diagram showing an internal view of a building that houses servers for a data center, in accordance with another example embodiment.

FIG. 5F is a diagram showing an internal view of a building that houses servers for a data center, in accordance with another example embodiment. As shown in this figure, the building includes a roof 501 and a stack (or chimney) structure 502a through which air from the building can flow into the environment. The building also includes housings for servers, such as housing 503, which includes a rack of servers (e.g., blade servers). Each server, such as server 504, includes (a) one or more processors (e.g., a microprocessor) and (b) one or more (e.g., 1, 2, or 3) computer fans such as computer fan 506, which might be variable as to activation, speed, direction, etc. Housing 503 is supported by the building floor 511 and connects to stack structure 502a. Stack structure 502a includes fan 515, which might be (a) variable as to activation, speed, direction, etc., and (b) used to pull (or push) warm air flowing out of the servers in housing 503 into the stack structure 502a.

As also depicted in FIG. 5F, a filter 507 (e.g., an air filter and/or a mesh filter) protects the interior of the building from such things as environmental particulates (including moisture) and/or debris (e.g., leaves, grass, dirt, sand, etc.). Louvered wall 514 might be used to keep out air from the environment, e.g., air which is relatively warm or relatively cold in comparison to air in the building. Louvered wall 514 might also be used for protection against wind, moisture, debris, and or other environmental hazards that are not fully protected against by filter 507. In an example embodiment, louvered wall 514 might be manually operated or automated. In an example embodiment, louvered wall 514 might include louvers whose size and spacing (e.g., a louvered wall with a relatively large number of louvers) have been selected so as to reduce the air pressure drop resulting from the presence of louvered wall 514.

Also shown in FIG. 5F is controller 508 which might control computer fan 506, fan 515, and/or the louvers in louvered wall 514, in an example embodiment. Controller 508 might include a computer device with software, firmware, and/or hardware (e.g., a microprocessor and volatile and/or persistent storage) connected to one or more sensors (e.g., a sensor that measures temperature, humidity, air pressure, particulate matter, etc.). In an example scenario, controller 508 might determine that the temperature of the air proximate to the servers has dropped (or risen) at a rate that exceeds the server manufacturer's maximum allowable rate of change downward (or upward), e.g., nine degrees Fahrenheit within one hour. And therefore, controller 508 might cause (e.g., through a command transmitted over a wire or wirelessly) the computer fans in the servers (such as computer fan 506) to operate at a higher speed. In another example embodiment, controller 508 might be a component of a server 504 and/or its computer fan 506, rather than external to server 504 a shown in FIG. 5F. Alternatively, controller 508 might remedy the rising temperature by activating (e.g., through a command transmitted over a wire or wirelessly) fan 515 or opening (e.g., through a command transmitted over a wire or wirelessly) the louvers in one or more of the louvered walls (e.g., louvered wall 514). It will be appreciated that fan 515 will supplement heat rejection by the server fans when the temperature of the air proximate to the servers has risen at a rate that exceeds the server manufacturer's maximum allowable rate of change upward, e.g., nine degrees Fahrenheit within one hour.

Or in another example scenario, controller 508 might determine that the temperature of the air proximate to the servers has dropped at a rate that exceeds the server manufacturer's maximum allowable rate of change downward, e.g., nine degrees Fahrenheit within one hour. And therefore, controller 508 might cause (e.g., through a command transmitted over a wire or wirelessly) the computer fans in the servers (such as computer fan 506) to turn in a direction that reduces the flow of warm air from the servers into the stack structure 502*a*. Here again, in another example embodiment, controller 508 might be a component of a server 504 and/or its computer fan 506, rather than external to server 504 as shown in FIG. 5F. Alternatively, controller 508 might remedy the falling temperature by deactivating (e.g., through a command transmitted over a wire or wirelessly) the fan 515 or closing (e.g., through a command transmitted over a wire or wirelessly) the louvers in one or more of the louvered walls (e.g., louvered wall 514).

Or in still another example scenario, controller 508 might determine that there has been a significant change (e.g., an increase) in the particulate matter in filter 507 (e.g., as measured by a sensor in filter 507) during a period of time (e.g., one hour), as a result of a forest fire or sandstorm. And therefore, controller 508 might activate fan 515 to increase the air flow and pull (or push) air away from the servers and into the stack structure 502*a*.

FIG. 6A is a diagram showing air flows in a building that houses servers for a data center, in accordance with an example embodiment. As depicted in this figure, air flows from the environment outside the building through the filter 507 (e.g., an air filter and/or a mesh filter) into a housing that includes a rack of servers (e.g., blade servers). The air is warmed by each server (e.g., by the server's processors or other integrated circuits) and is pulled (or pushed) by the servers' computer fans (e.g., computer fan 506) into the stack structure 502*a*. The warmed air then exits back into the environment through windows at the top of the stack structure 502*a*. In an example embodiment, all or part (e.g., the top part) of the stack structure 502*a* might be made of materials that warm the stack structure 502*a* (e.g., concrete) and enhance its stack effect. Or, all or part (e.g., the top part) of the stack structure 502*a* might include components such as mirrors that warm the stack structure 502*a* (e.g., concrete) and enhance its stack effect. Similarly, the length of the stack structure 502*a* might be extended to enhance its stack effect, in an example embodiment.

Figure 6B:
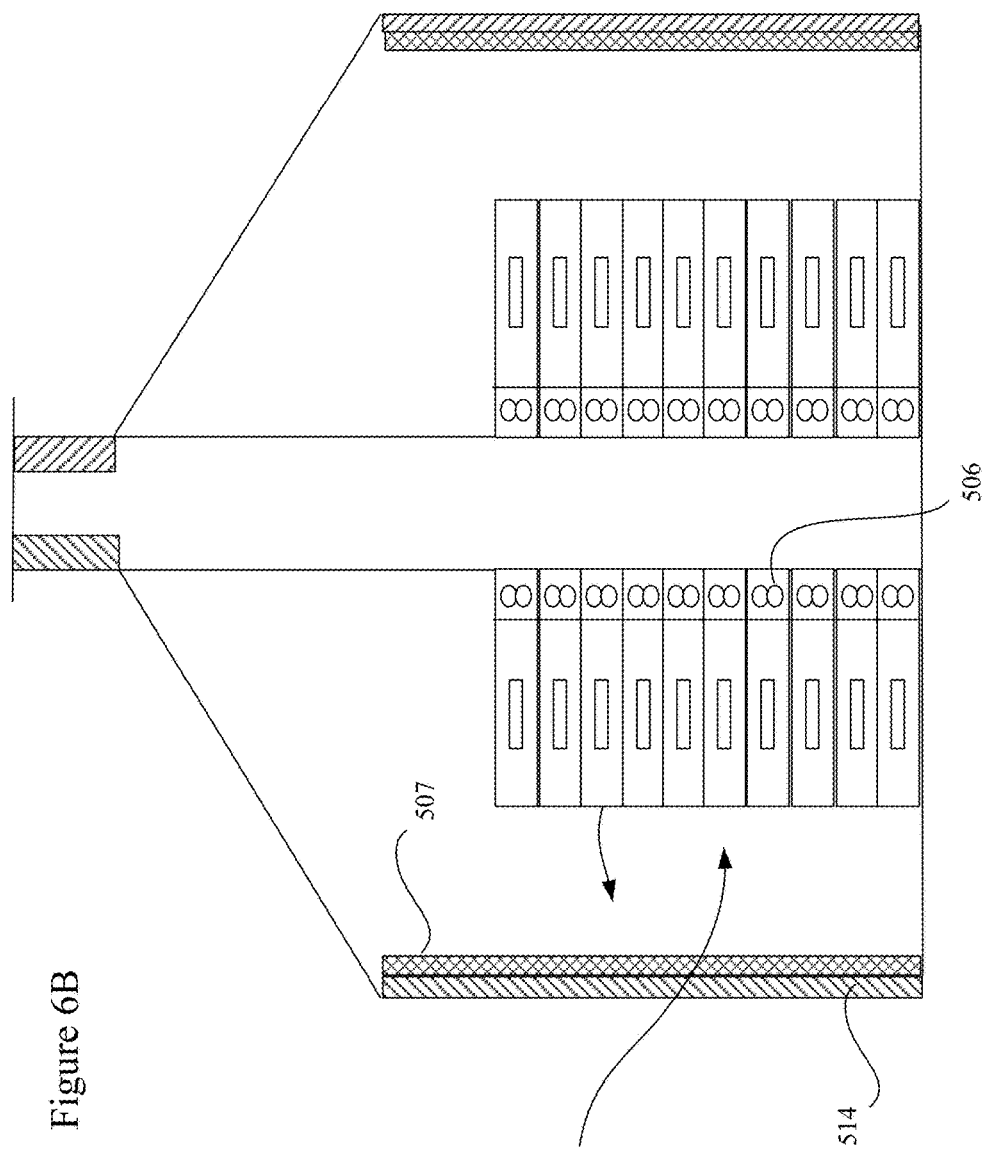
FIG. 6B is a diagram showing air flows in a building that houses servers for a data center, in accordance with another example embodiment.

FIG. 6B is a diagram showing air flows in a building that houses servers for a data center, in accordance with another example embodiment. As depicted in this figure, air flows from the environment outside the building through the louvered wall 514 and the filter 507 (e.g., an air filter and/or a mesh filter) into a housing that includes a rack of servers (e.g., blade servers). The air is warmed by each server (e.g., by the server's processors or other integrated circuits) and is pulled (or pushed) by the servers' computer fans (e.g., computer fan 506) away from the stack structure 502*a*. It will be appreciated that such an air flow might be used to warm the servers, e.g., when there has been a significant drop in the temperature of the air proximate to the servers within a short period of time.

Figure 7:
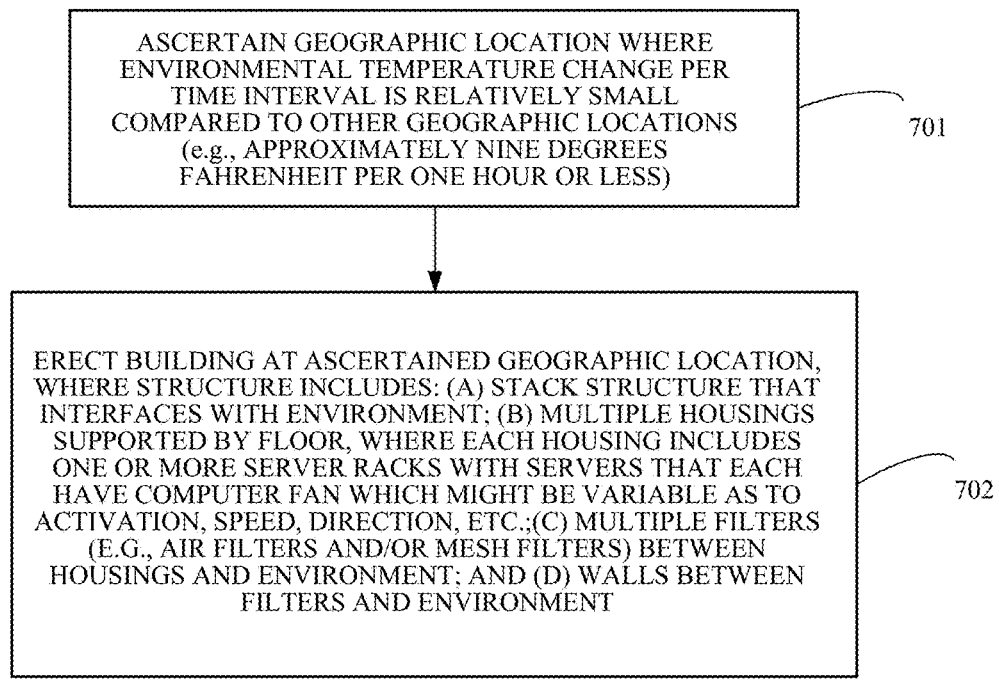
FIG. 7 is a flowchart diagram that illustrates a process for atmospheric cooling of servers in a data center, in accordance with an example embodiment.

FIG. 7 is a flowchart diagram that illustrates a process for atmospheric cooling of servers in a data center, in accordance with an example embodiment. In operation 701 of the process, an organization (e.g., an organization hosting a search engine, a social network, an online store, etc.) planning a data center ascertains a geographic location where the environmental temperature change per time interval is relatively small compared to other geographic locations (e.g., approximately nine degrees Fahrenheit per one hour). As indicated earlier, such a geographic location might not be in a cool clime. Then in operation 702, the organization erects (or constructs) a building at the ascertained geographic location, where the building might include: (a) a stack structure that interfaces with the environment; (b) multiple housings supported by a floor, where each housing includes one or more server racks with servers that each have a computer fan which might be variable as to activation, speed, direction, etc.; (c) multiple filters (e.g., air filters and/or mesh filters) between the housings and the environment; and (d) walls (e.g., roll-up or louvered) between the filters and the environment. In alternative embodiments, the building to be erected in operation 702 might include one or more of the other elements described elsewhere in this disclosure, e.g., a damper in the stack structure, a fan in the stack structure, an attic space, etc.

With the above example embodiments in mind, it should be understood that the example embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of these operations might be useful machine operations. The example embodiments might also include a device or an apparatus for performing these operations. The device might be specially constructed for the required purposes or it may be a general purpose computer selectively activated or configured by a computer program stored in the computer. In particular, various general purpose computers may be used with computer programs written in accordance with the teachings herein.

The example embodiments might also include computer-readable code on a computer-readable medium. The computer-readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer-readable medium can also be distributed over a network coupled computer systems so that the computer-readable code is stored and executed in a distributed fashion.

Although example embodiments have been described in some detail for purposes of clarity of understanding, it will be apparent that certain changes and modifications can be practiced within the scope of the following claims. Accordingly, the example embodiments are to be considered as illustrative and not restrictive, and the inventions are not to be limited to the details given herein, but may be modified within the scope and equivalents of the following claims. In the following claims, elements and/or steps do not imply any particular order of operation, unless explicitly stated in the claims or implicitly required by the disclosure.

What is claimed is:

1. An apparatus, comprising:
   a stack structure that interfaces with an environment;
   one or more housings coupled to a floor and the stack structure, wherein each of the housings includes one or more racks with a plurality of servers and wherein each of the servers includes a computer fan capable of varying speed or reversing direction;
   one or more filters between the one or more housings and the environment;
   one or more walls operable to be between the one or more filters and the environment, wherein at least one of the walls is a roll-up wall; and
   a controller that rolls down or rolls up the roll-up wall depending at least in part on a temperature measurement of the air proximate to the servers, wherein the temperature measurement determines whether a rate of change in temperature has occurred that exceeds an allowable rate of change in temperature determined by the manufacturer of the servers.

2. An apparatus as in claim 1, wherein the apparatus does not include a mixing chamber.

3. An apparatus as in claim 1, wherein each filter is an air filter.

4. An apparatus as in claim 1, wherein each filter is a mesh filter.

5. An apparatus as in claim 1, wherein the allowable rate of change in temperature is approximately a drop of nine degrees Fahrenheit within approximately one hour.

6. An apparatus as in claim 1, wherein the chimney structure includes a damper.

7. An apparatus as in claim 6, further comprising a controller that opens or closes the damper depending at least in part on a temperature measurement of the air proximate to the servers.

8. An apparatus as in claim 7, wherein the temperature measurement determines whether a rate of change in temperature has occurred that exceeds an allowable rate of change in temperature determined by the manufacturer of the server.

9. An apparatus as in claim 8, wherein the allowable rate of change in temperature is a drop of approximately nine degrees Fahrenheit within approximately one hour.

10. An apparatus as in claim 1, further comprising a fan that pushes or pulls air into the stack structure.

11. An apparatus as in claim 10, further comprising a controller that controls the fan depending at least in part on a temperature measurement of the air proximate to the servers.

12. An apparatus as in claim 11, wherein the temperature measurement determines whether a rate of change in temperature has occurred that exceeds an allowable rate of change in temperature determined by the manufacturer of the server.

13. An apparatus as in claim 12, wherein the allowable rate of change in temperature is a drop of approximately nine degrees Fahrenheit within approximately one hour.

14. An apparatus as in claim 1, wherein the stack structure includes components or materials that warm air passing through the stack structure.

15. An apparatus, comprising:
   an attic coupled to a floor, wherein the attic includes a stack structure that interfaces with an environment;
   one or more housings coupled to the floor, wherein each of the housings includes one or more racks with a plurality of servers and wherein each of the servers includes a computer fan capable of varying speed or reversing direction;
   one or more filters between the one or more housings and the environment;
   one or more walls operable to be between the one or more filters and the environment, wherein at least one of the walls includes one or more louvers; and
   a controller that opens or closes the one or more louvers depending at least in part on a temperature measurement of the air proximate to the servers, wherein the temperature measurement determines whether a rate of change in temperature has occurred that exceeds an allowable rate of change in temperature determined by the manufacturer of the servers.

16. An apparatus as in claim 15, wherein the attic includes a bottom surface that is coupled to the one or more housings.

17. An apparatus as in claim 15, wherein the apparatus does not include a mixing chamber.

18. An apparatus as in claim 15, wherein each filter is an air filter.

19. An apparatus as in claim 15, wherein each filter is a mesh filter.

20. A method, comprising:
   ascertaining a geographic location where the rate of environmental temperature change per time interval is relatively small compared to other geographic locations; and
   erecting a building at the ascertained geographic location, wherein the building comprises:
      a stack structure that interfaces with an environment;
      one or more housings coupled to a floor and the stack structure, wherein each of the housings includes one or more racks with a plurality of servers and wherein each of the servers includes a computer fan capable of varying speed or reversing direction;
      one or more filters between the one or more housings and the environment;
      one or more walls operable to be between the one or more filters and the environment, wherein at least one of the walls is a roll-up wall; and
      a controller that rolls down or rolls up the roll-up wall depending at least in part on a temperature measurement of the air proximate to the servers, wherein the temperature measurement determines whether a rate of change in temperature has occurred that exceeds an allowable rate of change in temperature determined by the manufacturer of the servers.

* * * * *